(12) United States Patent
Sakuma

(10) Patent No.: US 10,892,163 B2
(45) Date of Patent: Jan. 12, 2021

(54) SEMICONDUCTOR DEVICE WITH SIDE WALL PROTECTION FILM FOR BOND PAD AND WIRING

(71) Applicant: ABLIC Inc., Chiba (JP)

(72) Inventor: Tetsuya Sakuma, Chiba (JP)

(73) Assignee: ABLIC INC., Chiba (JP)

( * ) Notice: Subject to any disclaimer, the term of this patent is extended or adjusted under 35 U.S.C. 154(b) by 124 days.

(21) Appl. No.: 16/227,486

(22) Filed: Dec. 20, 2018

(65) Prior Publication Data

US 2019/0244808 A1 Aug. 8, 2019

(30) Foreign Application Priority Data

Feb. 5, 2018 (JP) .................................. 2018-018424

(51) Int. Cl.
| | | |
|---|---|---|
| *H01L 23/532* | (2006.01) | |
| *H01L 21/027* | (2006.01) | |
| *H01L 23/00* | (2006.01) | |
| *H01L 21/768* | (2006.01) | |
| *H01L 21/02* | (2006.01) | |

(52) U.S. Cl.
CPC ...... *H01L 21/0276* (2013.01); *H01L 21/0217* (2013.01); *H01L 21/02164* (2013.01); *H01L 21/02178* (2013.01); *H01L 21/02186* (2013.01); *H01L 21/76843* (2013.01); *H01L 23/53266* (2013.01); *H01L 24/08* (2013.01); *H01L 24/48* (2013.01)

(58) Field of Classification Search
None
See application file for complete search history.

(56) References Cited

U.S. PATENT DOCUMENTS

| | | | | |
|---|---|---|---|---|
| 2001/0022399 | A1* | 9/2001 | Koubuchi | H01L 23/585 257/758 |
| 2006/0249845 | A1 | 11/2006 | Takai et al. | |
| 2010/0295044 | A1 | 11/2010 | Homma et al. | |
| 2011/0100695 | A1* | 5/2011 | Lin | H05K 3/3452 174/261 |

FOREIGN PATENT DOCUMENTS

| | | |
|---|---|---|
| JP | 2006-303452 A | 11/2006 |
| JP | 5443827 B2 | 3/2014 |

* cited by examiner

*Primary Examiner* — Lex H Malsawma
(74) *Attorney, Agent, or Firm* — Brinks Gilson & Lione

(57) ABSTRACT

The method of manufacturing a semiconductor device includes: forming a conductive film including a first metal-containing film and an anti-reflection film including a second metal-containing film which is laminated on the first metal-containing film, the second metal-containing film being different from the first metal-containing film and laminated on the first metal-containing film; patterning the conductive film; forming side wall protection films on side surfaces of the patterned conductive film; etching the anti-reflection film in the patterned conductive film, after formation of the side wall protection films; forming a passivation film on the first metal-containing film and the side wall protection films; and forming, in the passivation film, an opening portion in which a part of a top surface of the first metal-containing film is exposed.

6 Claims, 4 Drawing Sheets

SEMICONDUCTOR DEVICE WITH SIDE WALL PROTECTION FILM FOR BOND PAD AND WIRING

RELATED APPLICATIONS

This application claims priority under 35 U.S.C. § 119 to Japanese Patent Application No. 2018-018424 filed on Feb. 5, 2018, the entire content of which is hereby incorporated by reference.

BACKGROUND OF THE INVENTION

1. Field of the Invention

The present invention relates to a method of manufacturing a semiconductor device and a semiconductor device, and more particularly, to a method of manufacturing a semiconductor device and a semiconductor device in which a passivation film covering a conductive film has an opening portion to expose top surfaces of a bonding pad and others formed from the conductive film.

2. Description of the Related Art

In semiconductor devices in general, an aluminum (Al) film or other metal film is patterned into the shape of a bonding pad, an opening portion is formed in a passivation film covering the bonding pad, and electric connection to the outside is made via a bonding pad portion exposed in the opening portion.

In a photolithography step in which the aluminum film or other metal film is patterned, an anti-reflection film which is composed of a titanium nitride (TiN) film or a similar film should be formed on the metal film in advance in order to accomplish desired patterning with high precision by preventing the reflection of light from causing halation in the exposure of resist. This leaves the anti-reflection film on the top surface of the bonding pad after the patterning. When the opening portion is formed in the passivation film covering the bonding pad, the anti-reflection film is removed following the removal of a part of the passivation film so that the top surface of the metal film is exposed in the opening portion. The anti-reflection film is exposed on an inner side surface of the thus formed opening portion, and the boundary between the anti-reflection film which is a titanium nitride film or the like, and the metal film which is an aluminum film or the like, is consequently exposed in the opening portion.

When the boundary between different kinds of metals, such as the titanium nitride film and the aluminum film, is exposed in the opening portion, the metal film (aluminum film) having higher ionization tendency, dissolves from the boundary with the anti-reflection film (titanium nitride film) having lower ionization tendency than the metal film, due to a local battery effect caused between the different kinds of metals in a subsequent fabrication step in which immersion into an aqueous solution is made, for example, in a dicing step. A deficient portion consequently generates in the bonding pad, and reaction product (aluminum hydroxide) of the dissolved metal film (aluminum film) adheres to the surface of the bonding pad as well.

In order to solve such a problem, for example, in Japanese Patent Application Laid-open No. 2006-303452, there is proposed a method in which an opening wider than the opening portion for the bonding pad portion is formed in the anti-reflection film composed of a titanium nitride film in advance, a passivation film (or an aluminum film that is the same film as the bonding pad) covering the entire surface is then formed, and the opening portion for the bonding pad portion is formed in the passivation film (or the aluminum film), to thereby avoid the exposure of the boundary between different kinds of metals, like the titanium nitride film and the aluminum film, in the opening portion.

In addition, in Japanese Patent Application Laid-open No. 2006-303452, there is proposed another method in which a laminated film including a metal film and an anti-reflection film is patterned into the shape of a bonding pad, a photoresist pattern covering areas other than the bonding pad is subsequently formed, the anti-reflection film on the metal film is entirely removed by etching with the photoresist pattern as a mask, and then the forming of a passivation film and the forming of an opening portion are executed, to thereby avoid forming a boundary between different kinds of metals (see FIG. 6 to FIG. 10 of Japanese Patent Application Laid-open No. 2006-303452).

Still another method is proposed in Japanese Patent Application Laid-open No. 2006-303452. In this method, a first passivation film and an anti-reflection film are simultaneously patterned to form an opening portion in which a top surface of an aluminum film or other metal film is exposed, and a second passivation film is subsequently formed on the entire surface and etched by sputter etching until the top surface of the metal film is exposed while an inner side surface of the opening portion is covered with the second passivation film, to thereby avoid the exposure of a boundary between different kinds of metals in the opening portion (see FIG. 17 to FIG. 22 of Japanese Patent Application Laid-open No. 2006-303452).

The exposure of the anti-reflection film on the inner side surface of the opening portion which is formed in the passivation film covering the bonding pad as described above, poses another problem in that the anti-reflection film is oxidized and corroded in a long-term reliability test involving bias voltage application in a high-temperature and high-humidity environment, including the THB test.

A method for solving this problem is proposed in, for example, Japanese Patent No. 5443827. In the proposed method, similarly to the first method presented in Japanese Patent Application Laid-open 2006-303452, an opening wider than the opening portion for the bonding pad portion is formed in the anti-reflection film in advance, a passivation film covering the entire surface is then formed, and the opening portion for the bonding pad portion is formed in the passivation film, to thereby avoid the exposure of the anti-reflection film on the inner side surface of the opening portion.

In the first method presented in Japanese Patent Application Laid-open No. 2006-303452 an additional photolithography step is required to form the opening wider than the opening portion for the bonding pad portion in the anti-reflection film, which increases the number of masks and the number of steps and leads to an increase in cost.

The second method presented in Japanese Patent Application Laid-open No. 2006-303452 requires an additional photolithography step as well. The second method may further cause a decrease in reliability as illustrated in FIG. 7A and FIG. 7B.

FIG. 7A is an illustration in which a barrier metal layer 211, a metal film 212, and an anti-reflection film 213 are laminated on an interlayer insulating film 201, the laminated film is patterned into the shape of a bonding pad 221 and the shape of wiring 222, and a photoresist pattern 251 having an opening 252 above the bonding pad 221 is formed. The barrier metal layer 211 and the anti-reflection film 213 are composed of films containing the same metal, for example, titanium nitride.

In the formation of the photoresist pattern 251 which has the opening 252 above the bonding pad 221 as in the case described here, it is very difficult to make an inner side surface of the opening of the photoresist pattern just align with an edge portion of the bonding pad in the way illustrated in FIG. 7 of Japanese Patent Application Laid-open No. 2006-303452. Usually, the bonding pad 221 and the opening 252 of the photoresist pattern 251 are misaligned as illustrated in FIG. 7A.

When the anti-reflection film 213 on the bonding pad 221 is etched with the photoresist pattern 251 as a mask, the top surface of the anti-reflection film 213 is hence partially covered with the photoresist pattern 251 as illustrated in FIG. 7B. The anti-reflection film 213 thereby remains on the top surface of a part of the metal film 212 in the bonding pad 221. In addition, because the anti-reflection film 213 and the barrier metal layer 211 are films containing the same metal, and the barrier metal layer 211 is exposed in a gap between the bonding pad 221 and the photoresist pattern 251, the barrier metal layer 211, too, is etched in the etching of the anti-reflection film 213, and a notch Nt is consequently generated.

When a passivation film is subsequently formed on the entire surface while the anti-reflection film 213 remains, and an opening portion for exposing the top surface of the bonding pad 221 is formed in the passivation film, there is a possibility that, despite all efforts, the boundary between the metal film 212 and the anti-reflection film 213 is exposed on an inner side surface of the opening portion. Further, when the passivation film is formed on the entire surface under the presence of the generated notch Nt, the passivation film is not formed around the notch Nt, which helps the formation of a crack and the like in the passivation film leading to a decrease in reliability.

The third method presented in Japanese Patent Application Laid-open No. 2006-303452 requires over-etching excessive enough to ensure that the second passivation film does not remain on the top surface of the bonding pad when the second passivation film is etched by sputter etching until the top surface of the metal film is exposed. The excessive etching causes the etching of the first passivation film as well, and the reduction of the film thickness may disadvantageously affect reliability.

With the method of Japanese Patent No. 5443827, which is claimed to be capable of solving the problem of anti-reflection film corrosion in a long-term reliability test that involves bias voltage application in a high-temperature and high-humidity environment, there still remains a risk in that, even though the anti-reflection film is not exposed on the inner side surface of the opening portion for the bonding pad portion, the remaining anti-reflection film is corroded as a result of the permeation of moisture from a moisture permeation path, which is a fine crack or the like present in the passivation film for some reason.

SUMMARY OF THE INVENTION

It is an object of the present invention to provide a highly reliable method of manufacturing a semiconductor device and a semiconductor device in which, when an anti-reflection film is used to pattern a metal film with high precision, generation of a local battery effect between different kinds of metals due to the presence of the anti-reflection film can be prevented without an additional photolithography step, and corrosion of the anti-reflection film can be prevented in a long-term reliability test that involves bias voltage application in a high-temperature and high-humidity environment.

In one embodiment of the present invention, there is provided a method of manufacturing a semiconductor device including: forming a conductive film including a first metal-containing film and an anti-reflection film consisting of a second metal-containing film which is laminated on the first metal-containing film, the second metal-containing film being different from the first metal-containing film; patterning the conductive film; forming side wall protection films on side surfaces of the patterned conductive film; etching away the anti-reflection film in the patterned conductive film under a state in which the side wall protection films are formed; forming a passivation film so as to cover the first metal-containing film and the side wall protection films; and forming, in the passivation film, an opening portion in which a part of a top surface of the first metal-containing film is to be exposed.

According to one embodiment of the present invention, since the anti-reflection film is removed after the formation of the side wall protection film on the side surfaces of the patterned conductive film, addition of a photolithography step for removing the anti-reflection film is not required. In addition, because the patterned anti-reflection film is removed, a boundary between different kinds of metals is not formed between the first metal-containing film and the second metal-containing film which is the anti-reflection film, and the generation of the battery effect is consequently prevented. Further, even when the conductive film includes a barrier metal layer below the first metal-containing film, the side wall protection films formed on the side surfaces of the conductive film prevent etching of the barrier metal layer and generation of a notch in the removal of the anti-reflection film. A highly reliable semiconductor device can thus be obtained.

BRIEF DESCRIPTION OF THE DRAWINGS

Embodiments of the invention will now be described, by way of example, with reference to the accompanying drawings, in which.

DETAILED DESCRIPTION OF THE PREFERRED EMBODIMENTS

The invention will now be described herein with reference to illustrative embodiments.

FIG. 1 to FIG. 6 are sectional views for illustrating steps of manufacturing a semiconductor device according to an embodiment of the present invention.

Figure 1:
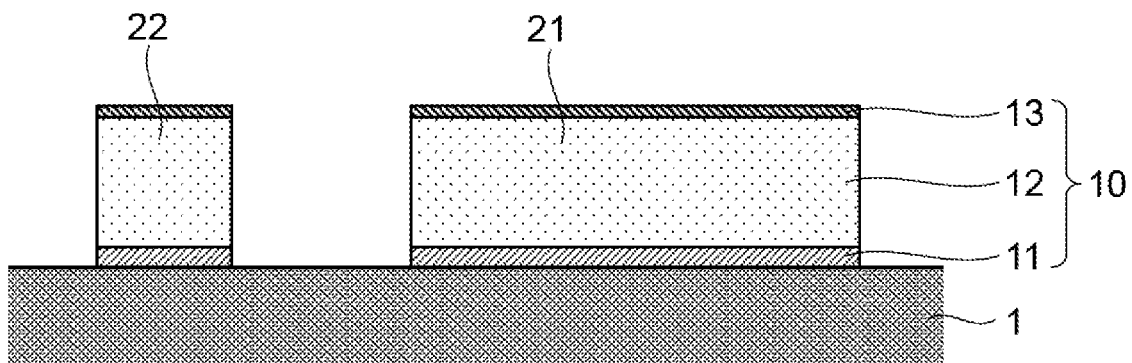
FIG. 1 is a sectional view for illustrating one of steps of manufacturing a semiconductor device according to an embodiment of the present invention.

As illustrated in FIG. 1, a conductive film (also referred to as "wiring layer") 10 is formed on an interlayer insulating film 1 which is formed on a semiconductor substrate (not shown). The conductive film 10 has a laminated structure in which different kinds of metals are laminated by sequentially depositing, by means of sputtering or the like, materials of a barrier metal layer 11, a metal film (also referred to as "first metal-containing film") 12, and an anti-reflection film (also referred to as "second metal-containing film") 13. The barrier metal layer 11 is formed by layering a titanium nitride film and a titanium film in this order. The metal film 12 is made from aluminum. The anti-reflection film 13 is made from titanium nitride. A photoresist pattern (not shown) is then formed on the conductive film 10 in a photolithography step, and the conductive film 10 is patterned with the photoresist pattern as a mask, to thereby form a bonding pad 21 and a wiring 22.

Figure 2:
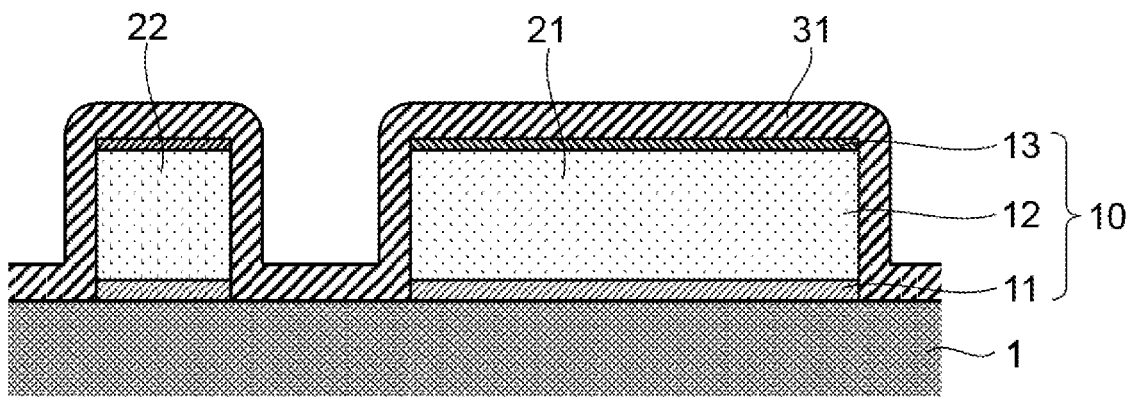
FIG. 2 is a sectional view for illustrating one of steps of manufacturing the semiconductor device following the step of FIG. 1 according to the embodiment of the present invention.

Next, as illustrated in FIG. 2, an insulating film 31 including a silicon oxide film, is formed by CVD on the entire surface so as to cover top and side surfaces of the patterned conductive film 10, that is, the bonding pad 21 and the wiring 22.

Figure 3:
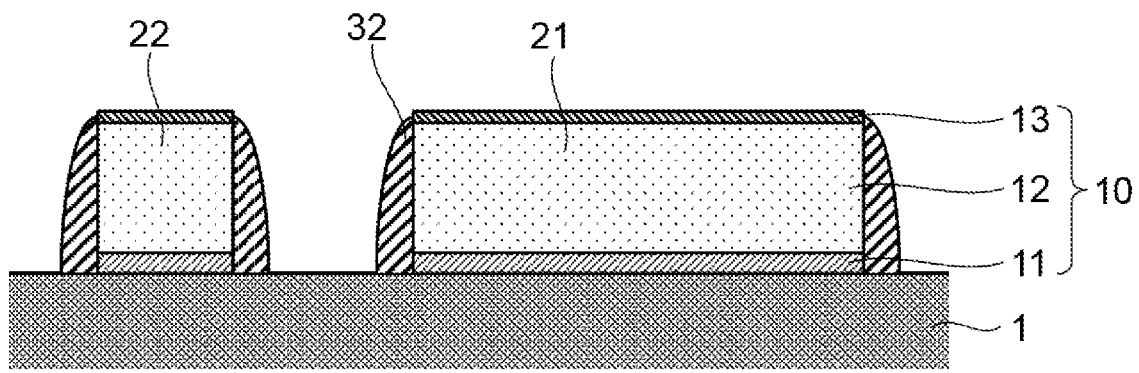
FIG. 3 is a sectional view for illustrating one of steps of manufacturing the semiconductor device following the step of FIG. 2 according to the embodiment of the present invention.

As illustrated in FIG. 3, the insulating film 31 is subsequently etched back by anisotropic dry etching. The etching back lasts until a top surface of the anti-reflection film 13 is exposed. Side wall protection films 32 are thereby formed on side surfaces of the bonding pad 21 and the wiring 22.

Figure 4:
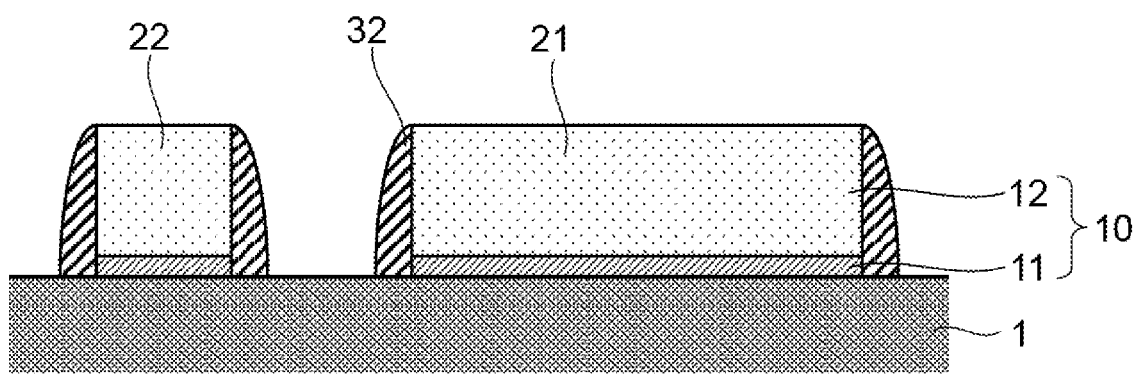
FIG. 4 is a sectional view for illustrating one of steps of manufacturing the semiconductor device following the step of FIG. 3 according to the embodiment of the present invention.

After the formation of the side wall protection film 32, as illustrated in FIG. 4, the anti-reflection film 13 is removed by dry etching, or by etching using a hydrogen peroxide solution or other chemical solution. In the etching, the anti-reflection film 13 can be removed entirely without etching the barrier metal layer 11 which is composed of a film containing titanium which is the same as the titanium nitride film constituting the anti-reflection film 13, because the side walls of the bonding pad 21 and the wiring 22 are protected by the side wall protection films 32 composed of silicon oxide films. The conductive film 10 is accordingly prevented from developing a notch.

Figure 5:
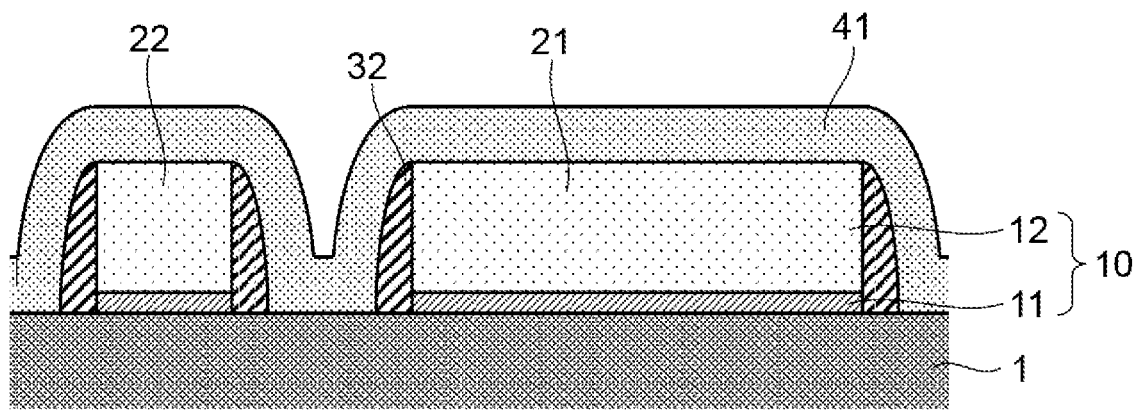
FIG. 5 is a sectional view for illustrating one of steps of manufacturing the semiconductor device following the step of FIG. 4 according to the embodiment of the present invention.

Next, as illustrated in FIG. 5, a passivation film 41 which is a laminated film including a silicon oxide film and a silicon nitride film, is formed by CVD so as to cover the entire surface including a top surface of the metal film 12 and surfaces of the side wall protection films 32. A situation in which the passivation film 41 fails to be formed in places can be avoided in this step because no notch is generated under the bonding pad 21. Another advantageous effect is that the side wall protection films 32 lessen steepness of the shape of level differences of the bonding pad 21 and the wiring 22, to thereby allow deposition of the passivation film 41 with an excellent coverage. Cracking and other problems in the passivation film can therefore be prevented, which improves reliability.

Figure 6:
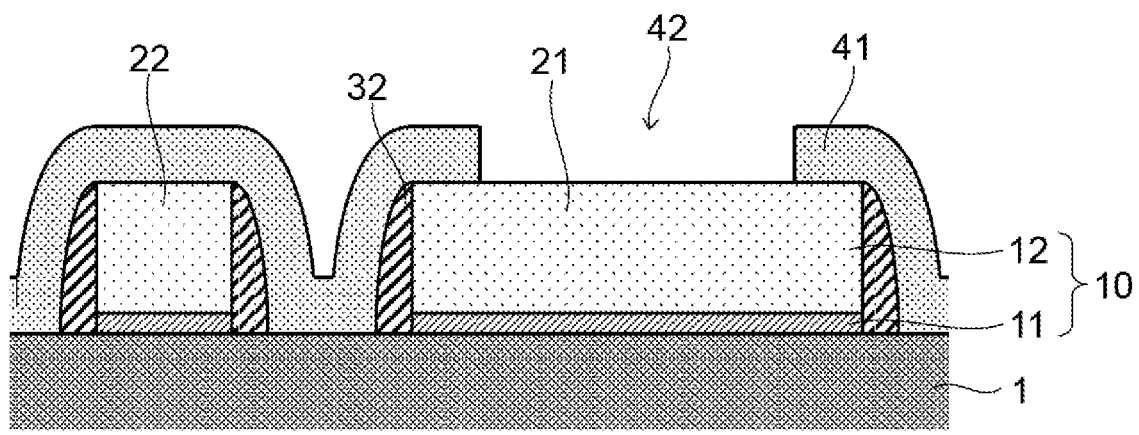
FIG. 6 is a sectional view for illustrating one of steps of manufacturing the semiconductor device following the step of FIG. 5 according to the embodiment of the present invention.
Figure 7A:
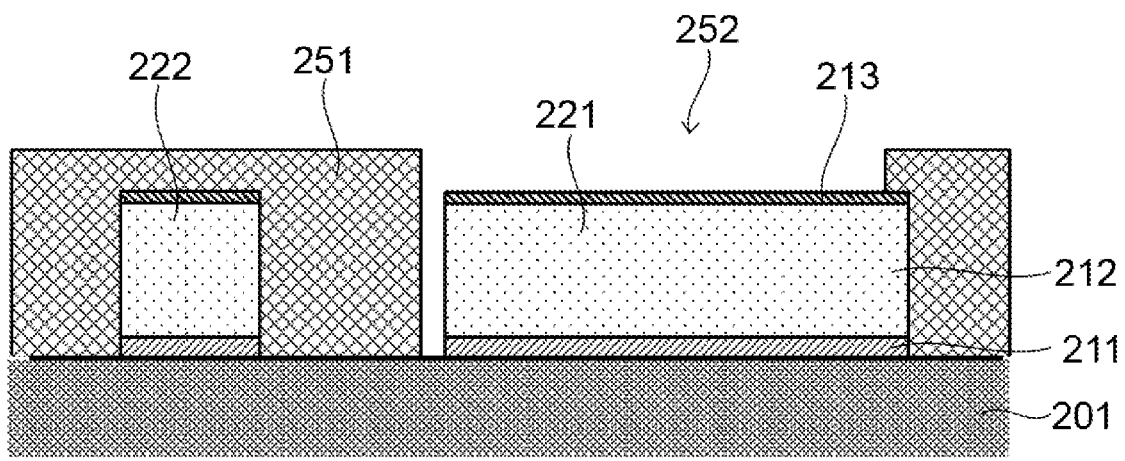
FIG. 7A and FIG. 7B are sectional views for illustrating steps of manufacturing a semiconductor device of the related art.
Figure 7B:
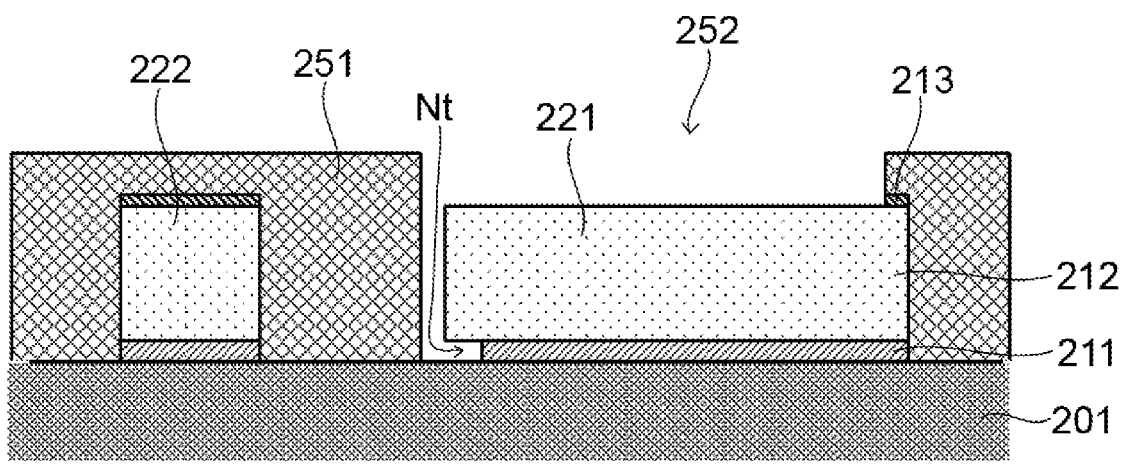

Next, as illustrated in FIG. 6, a photoresist pattern (not shown) having an opening above the bonding pad 21 is formed and used as a mask in a subsequent photolithography step to pattern the passivation film 41 and to form an opening portion 42 above a part of the bonding pad 21. The part of the top surface of the bonding pad 21 that is exposed in the opening portion 42 is thus made into a bonding pad portion. In the step of FIG. 6, the anti-reflection film 13 which has already been removed in the steps illustrated in FIG. 2 to FIG. 3, is not exposed on an inner side surface of the opening portion 42, and the battery effect can therefore be prevented.

Generally, an anti-reflection film is used in the patterning of a metal film in order to accomplish desired patterning with high precision, namely, a minute wiring width and wiring space. The width of the wiring 22, the space between the bonding pad 21 and the wiring 22, and the space between wiring wires (not shown) (they are both referred to as "wiring space") are accordingly very narrow in this embodiment. For example, the wiring width is 1 µm or less, and the wiring space is 1 µm or less.

According to this embodiment, even with that minute wiring width and wiring space, the metal film 12 can be patterned with high precision with the use of the anti-reflection film 13, the battery effect can be prevented, no notch is generated at a lower edge of the bonding pad 21, and the passivation film 41 can be formed with an excellent coverage. A highly reliable semiconductor device can thus be obtained according to this embodiment.

It is apparent that the present invention is not limited to the above embodiments, and may be modified and changed without departing from the scope and spirit of the invention.

For instance, while the embodiment described above deals with an example of removing the anti-reflection film 13 by dry etching or by etching using a hydrogen peroxide solution or other chemical solution, the present invention is not limited thereto. The anti-reflection film 13 may be removed by performing continuously etching in the etching back step of the insulating film 31, until the metal film 12 is exposed.

The side wall protection films may be a silicon nitride film instead of the silicon oxide film.

The embodiment described above deals with an example in which the first metal-containing film is an aluminum film and the second metal-containing film (anti-reflection film) is a titanium nitride film. However, the first metal-containing film may be an aluminum alloy film, and the second metal-containing film may be a titanium film.

The passivation film which is a laminated film including a silicon oxide film and a silicon nitride film in the example of the embodiment described above, may be a single-layer silicon oxide film or a single-layer silicon nitride film.

What is claimed is:

1. A semiconductor device, comprising:
    a bonding pad and a wiring each in the same wiring layer composed of a metal-containing film, and adjacent to each other across a distance of 1 µm or less;
    side wall protection films on side surfaces of the bonding pad and side surfaces of the wiring, the side wall protection films comprising one of silicon oxide films and silicon nitride films; and
    a passivation film covering a top surface of the bonding pad, a top surface of the wiring, and surfaces of the side wall protection films, and having an opening portion exposing a part of the top surface of the bonding pad, the passivation film in direct contact with the top surface of the bonding pad and the top surface of the wiring.

2. The semiconductor device according to claim 1, further comprising a barrier metal layer located below the metal-containing film, the barrier metal layer including one of a titanium film, a titanium nitride film, and a laminated film including a titanium film and a titanium nitride film.

3. The semiconductor device according to claim 1, wherein the metal-containing film is one of an aluminum film and an aluminum alloy film.

4. The semiconductor device according to claim 3, further comprising a barrier metal layer located below the metal-containing film, the barrier metal layer including one of a titanium film, a titanium nitride film, and a laminated film including a titanium film and a titanium nitride film.

5. The semiconductor device according to claim 1, further comprising a barrier metal layer located below the metal-containing film, the barrier metal layer including one of a titanium film, a titanium nitride film, and a laminated film including a titanium film and a titanium nitride film.

6. The semiconductor device according to claim 1, wherein the passivation film is one of a silicon oxide film, a silicon nitride film, and a laminated film including a silicon oxide film and a silicon nitride film.

* * * * *